(12) United States Patent
Yamamoto et al.

(10) Patent No.: US 12,034,438 B2
(45) Date of Patent: Jul. 9, 2024

(54) SIGNAL DETECTION CIRCUIT

(71) Applicant: DENSO CORPORATION, Kariya (JP)

(72) Inventors: Masahiro Yamamoto, Kariya (JP); Akimasa Niwa, Kariya (JP)

(73) Assignee: DENSO CORPORATION, Kariya (JP)

( * ) Notice: Subject to any disclaimer, the term of this patent is extended or adjusted under 35 U.S.C. 154(b) by 239 days.

(21) Appl. No.: 17/747,198

(22) Filed: May 18, 2022

(65) Prior Publication Data

US 2022/0376689 A1 Nov. 24, 2022

(30) Foreign Application Priority Data

May 19, 2021 (JP) ................. 2021-084647

(51) Int. Cl.
| | |
|---|---|
| H03K 17/687 | (2006.01) |
| H03K 17/00 | (2006.01) |
| H03K 17/081 | (2006.01) |
| H03K 17/082 | (2006.01) |
| H03K 17/18 | (2006.01) |

(52) U.S. Cl.
CPC ......... H03K 17/687 (2013.01); H03K 17/002 (2013.01); H03K 17/08104 (2013.01); H03K 17/0822 (2013.01); H03K 17/18 (2013.01); *H01L 2924/19041* (2013.01); *H03K 2217/0054* (2013.01)

(58) Field of Classification Search
CPC ............. H03K 17/002; H03K 17/0822; H03K 17/08104; H03K 17/687; H03K 17/18
See application file for complete search history.

(56) References Cited

U.S. PATENT DOCUMENTS

| | | | |
|---|---|---|---|
| 2007/0096174 A1* | 5/2007 | Higuchi | .............. H01L 27/1203 257/E29.279 |
| 2020/0021282 A1 | 1/2020 | Yamamoto et al. | |
| 2021/0036697 A1 | 2/2021 | Yamamoto et al. | |
| 2021/0258004 A1 | 8/2021 | Akiyama et al. | |

FOREIGN PATENT DOCUMENTS

JP 2020-113867 A 7/2020

OTHER PUBLICATIONS

Kawai et al., "A 4.5V/ns Active Slew-Rate-Controlling Gate Driver with Robust Discrete-Time Feedback Technique for 600V SuperjunctionMOSFETs", ISSCC 2019 / Session 15 / Power for 5G, Wirelesspower, and GAN Converters / 15.8, Feb. 2019.

* cited by examiner

*Primary Examiner* — Alesa Allgood
(74) *Attorney, Agent, or Firm* — Posz Law Group, PLC

(57) ABSTRACT

A signal detection circuit includes: a voltage dividing circuit having at least a first pair of voltage dividing capacitors connected in series for dividing an input voltage and configured to output a divided voltage, and a detection circuit configured to detect the divided voltage. The first pair of voltage dividing capacitors are included in one semiconductor device. The semiconductor device includes: (i) a semiconductor substrate, (ii) a first conductor layer, (iii) a first dielectric layer, (iv) a second conductor layer, (v) a second dielectric layer, (vi) a third conductor layer, and (vii) a short-circuit portion configured to short-circuit the first conductor layer and the semiconductor substrate.

12 Claims, 10 Drawing Sheets

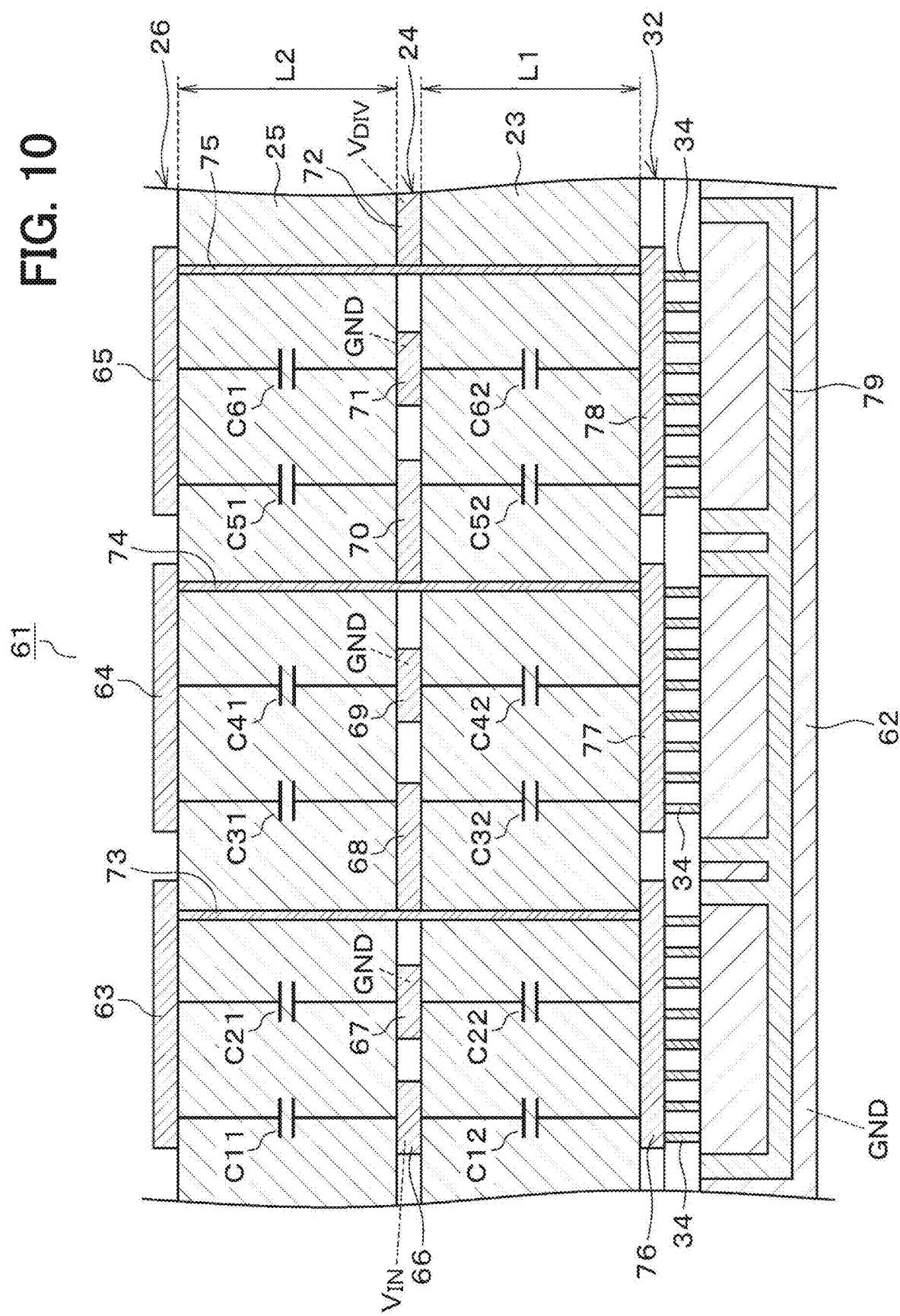

SIGNAL DETECTION CIRCUIT

CROSS REFERENCE TO RELATED APPLICATION

The present application is based on and claims the benefit of priority of Japanese Patent Application No. 2021-084647, filed on May 19, 2021, the disclosure of which is incorporated herein by reference.

TECHNICAL FIELD

The present disclosure generally relates to a signal detection circuit that detects a detection-target signal, which is a signal of a main terminal of a switching element.

BACKGROUND INFORMATION

Conventionally, in a gate drive circuit that drives a gate of a switching element such as an IGBT or MOSFET, a technology for suppressing a surge generated during switching, and a technology for controlling dV/dt, which is the rate of change of the voltage of the main terminal of the switching element, etc. have been demanded. A comparative example discloses a technique for controlling dV/dt to a desired value by manipulating the timing at which one of two types of gate resistors is turned on based on an observation result of a drain-source voltage of the switching element. In the above techniques, a signal detection circuit that detects a detection-target signal, which is a signal of the main terminal of the switching element, is used.

SUMMARY

It is an object of the present disclosure to provide a signal detection circuit capable of improving detection accuracy while suppressing an increase in size of the circuit.

BRIEF DESCRIPTION OF THE DRAWINGS

Objects, features, and advantages of the present disclosure will become more apparent from the following detailed description made with reference to the accompanying drawings, in which:

FIG. 10 is a specific configuration example of a capacitor constituting the voltage dividing circuit according to a fourth embodiment, and is a schematic cross-sectional view of the semiconductor device.

DETAILED DESCRIPTION

Figure 1:
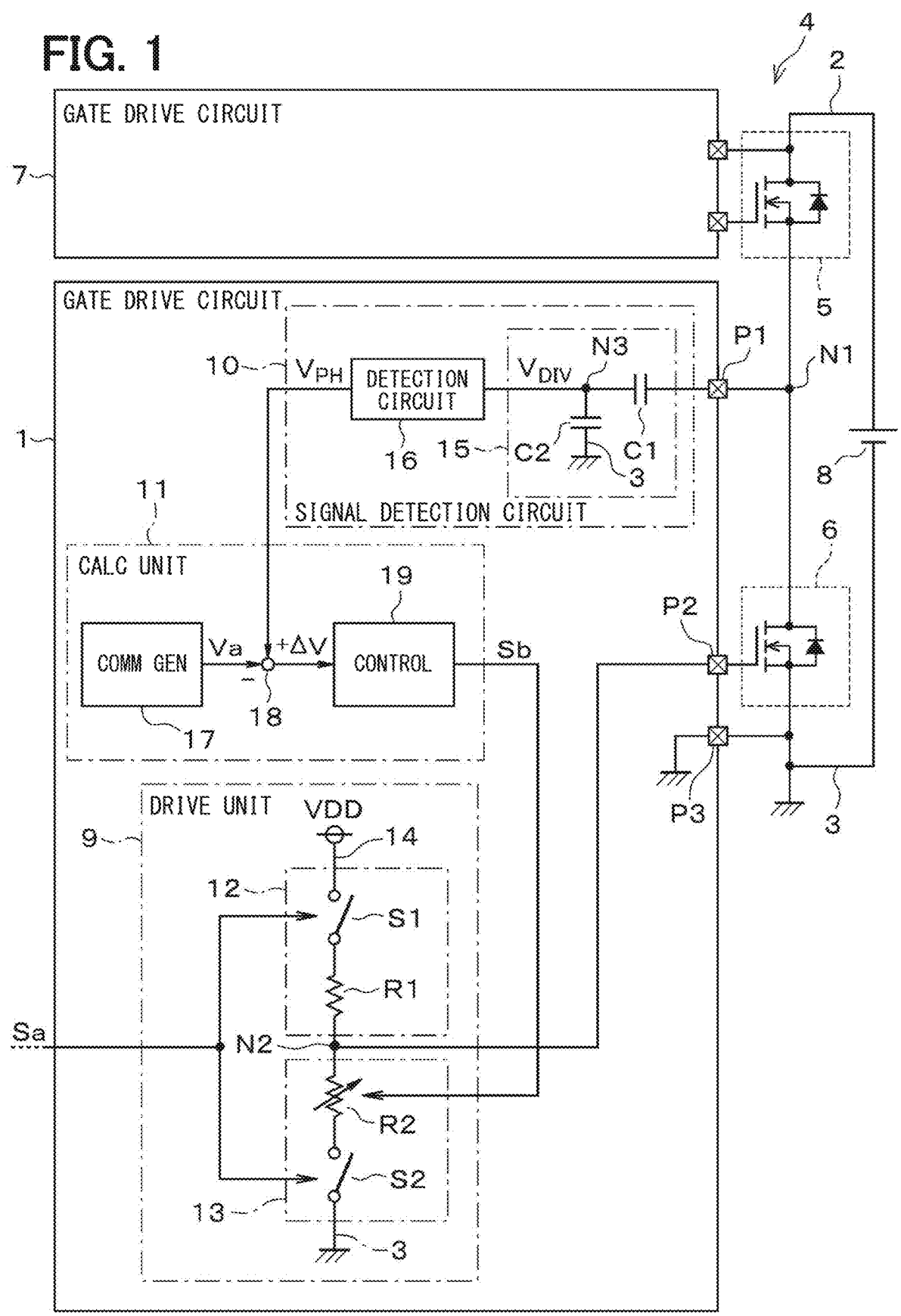
FIG. 1 is a diagram schematically showing a configuration of a gate drive circuit according to a first embodiment.

Hereinafter, multiple embodiments will be described with reference to the drawings. In each of those embodiments, substantially same components are marked by same reference numerals and description thereof may be omitted.

First Embodiment

Hereinafter, the first embodiment will be described with reference to FIG. 1 to FIG. 3.

<General Configuration>

As shown in FIG. 1, a gate drive circuit 1 of the present embodiment drives a gate of a switching element 6 constituting a lower arm, among switching elements 5 and 6 of a half bridge circuit 4 connected between a pair of direct current (DC) power supply lines 2 and 3. The switching element 5 constituting an upper arm of the half-bridge circuit 4 is driven a gate drive circuit 7 having the same configuration as the gate drive circuit 1.

In such case, the driving of the switching elements 5 and 6 is PWM controlled based on a control signal given from an outside. PWM is an abbreviation for Pulse Width Modulation. The switching elements 5 and 6 are power elements, and, in the present embodiment, are all N-channel type power MOSFETs. A drain, which is one of the main terminals (upper terminal in FIG. 1) of the switching element 5, is connected to the direct current (DC) power supply line 2 on a high potential side, which is connected to a high potential side terminal of a DC power supply such as a battery (8).

A source, which is the other main terminal (lower terminal) of the switching element 5, is connected to a drain, which is one of the main terminals (upper terminal in FIG. 1) of the switching element 6. A source, which is the other main terminal (lower terminal) of the switching element 6, is connected to the DC power supply line 3 on a low potential side connected to a low potential side terminal of the DC power supply described above. In the present embodiment, the power supply voltage output from the above-mentioned DC power supply is a relatively high voltage such as 600 V or the like. That is, in the present embodiment, the switching elements 5 and 6 are used for high voltage applications. Although not shown, a load such as an inductor or a coil of a motor is connected to a node N1 which serves as an interconnection node between the switching elements 5, 6.

The gate drive circuit 1 is configured as a semiconductor device, that is, as an IC, and includes: (i) a terminal P1 connected to the interconnection node N1, (ii) a terminal P2 connected to the gate of the switching element 6, (iii) a terminal P3 connected to the source of the switching element 6, (iv) a drive unit 9, (v) a signal detection circuit 10, and (vi) a calculation unit 11. The drive unit 9 drives the gate of the switching element 6 based on a control signal Sa given from the outside, and includes an on-drive unit 12 (for driving P2 high to switch ON the lower switching element 6) and an off-drive unit 13 (for driving P2 low to switch OFF the lower switching element 6).

The on-drive unit 12 includes a switch S1 and a gate resistor R1. The switch S1 opens and closes connection between (i) a power supply line 14 to which a power supply voltage VDD is supplied and (ii) one terminal of the gate resistor R1. The power supply voltage VDD is a voltage sufficiently higher than a gate threshold voltage of the switching element 6, and is, for example, 20 V. The other terminal of the gate resistor R1 is connected to a node N2 connected to the terminal P2. Note, node N1 may be described as a load interconnection node, and node N2 may be described as a lower drive interconnection node. The upper drive circuit y has an upper drive interconnection node (not shown) to control the upper switching element 5.

The off-drive unit 13 includes a switch S2 and a gate resistor R2. The switch S2 opens and closes connection between (i) the DC power supply line 3 and (ii) one terminal of the gate resistor R2. The other terminal of the gate resistor R2 is connected to the node N2. The switch S1 of the on-drive unit 12 and the switch S2 of the off-drive unit 13 are complementarily turned ON and OFF based on the control signal Sa.

According to the above configuration, the switching element 6 is turned on when the switch S1 of the on-drive unit 12 is turned on, and the switching element 6 is turned off when the switch S2 of the off-drive unit 13 is turned on. Note that, in such case, the on-drive unit 12 is configured to drive the gate of the switching element 6 with/at a constant voltage VDD. However, the gate of the switching element 6 may be driven with a constant current (not shown).

In the above configuration, a resistance value of the gate resistor (variable resistor) R2 of the off-drive unit 13 is variable. That is, in the above configuration, a drive capacity of the drive unit 9, specifically, the drive capacity of the drive unit 9 when the switching element 6 is turned off can be changed. The drive capacity of the drive unit 9, that is, the resistance value of the gate resistor R2 of the off-drive unit 13 is set to a value corresponding to a capacity command signal Sb output from the calculation unit 11.

The signal of the main terminal of the switching element 6 is input to the signal detection circuit 10 via the terminals P1 and P3. That is, in the present embodiment, a voltage VDS between the drain and the source of the switching element 6 becomes a detection-target signal detected by the signal detection circuit 10. In such a configuration, the signal detection circuit 10 detects a peak voltage of the voltage VDS of the switching element 6 at the time of turn-off of the switching element 6, that is, the peak of the surge voltage generated at the time of turn-off. Note that the signal detection circuit 10 can also be used for detecting dV/dt, which is the rate of change of the voltage VDS of the switching element 6. The signal detection circuit 10 includes a voltage dividing circuit 15 and a detection circuit 16. The voltage dividing circuit 15 includes two capacitors C1 and C2. More specifically, in FIG. 1 the detection circuit 16 detects and outputs a peak hold voltage VPH which is a peak divided voltage VDIV of the voltage VDS at the load interconnection node N1.

One terminal of the capacitor C1 is connected to the terminal P1, and the other terminal is connected to a ground (or to the terminal P3) via the capacitor C2. That is, the voltage dividing circuit 15 has a configuration including capacitors C1 and C2 connected in series. In such case, the capacitors C1 and C2 function as a pair of voltage dividing capacitors, and have a high breakdown voltage so as not to fail even if a relatively high voltage generated in the node N1 is applied. In the above configuration, the voltage dividing circuit 15 divides an input voltage VIN, which is the voltage VDS between the main terminals of the switching element 6, by using the capacitors C1 and C2. Specifically, the voltage dividing circuit 15 divides the input voltage VIN by the capacitance ratio of the capacitors C1 and C2, and outputs a divided voltage VDIV from the node N3 which is an interconnection node of the capacitors C1 and C2 (also known as a lower voltage divider interconnection node N3).

The detection circuit 16 detects the detection-target signal based on a divided voltage VDIV, which is an output voltage of the voltage dividing circuit 15. In such case, the detection circuit 16 is configured as a peak hold circuit that inputs the divided voltage VDIV and outputs a peak hold voltage VPH that holds/memorizes a peak of the divided voltage VDIV. The peak hold voltage VPH output from the detection circuit 16 has a voltage value corresponding to a detection value of the peak voltage. In the following, the peak hold voltage VPH is also referred to as a peak divided detection voltage VPH, or simply as a detection voltage.

The calculation unit 11 performs feedback control such as changing the drive capacity of the drive unit 9 so that the value detected by the signal detection circuit 10, that is, the detection value of the peak of the surge voltage matches a desired command value. In such case, the desired command value is a surge tolerance voltage. The surge tolerance voltage is a value lower than the breakdown voltage of the switching element 6 by a predetermined margin, and even if a voltage of that value is applied to the main terminal, there is no possibility that the switching element 6 will fail, but when a voltage exceeding that value is applied to the main terminal, that may possibly cause the switching element 6 to fail. In the present embodiment, the surge tolerance voltage is set to, for example, 1200 V.

The calculation unit 11 includes a command generation unit 17, a subtractor 18, and a control unit 19. The command generation unit 17 generates a command voltage Va corresponding to the surge tolerance voltage. The subtractor 18 subtracts the command voltage Va from the detection voltage VPH to obtain a deviation ΔV corresponding to a difference between the detection value of the peak of the surge voltage peak and the command value, and outputs the deviation ΔV to the control unit 19. The control unit 19 executes a PI calculation for the deviation ΔV to generate a capacity setting signal Sb. The capacity setting signal Sb is output to the drive unit 9, whereby the resistance value of the gate resistor R2, that is, the drive capacity at the time of turn-off of the drive unit 9 is set.

In such a configuration, the calculation unit 11 obtains a deviation ΔV corresponding to the difference between the detection value of the peak of the surge voltage and the surge tolerance voltage which is a desired command value, and the drive capacity of the drive unit 9 is changed to gradually decrease the deviation V. In such case, the deviation ΔV corresponds to a degree of margin indicating how much the peak of the surge voltage has a margin relative to the breakdown voltage of the switching element 6. That is, the calculation unit 11 changes the drive capacity of the drive unit 9 so that the margin is gradually reduced.

In such case, the calculation unit 11 obtains the deviation ΔV for each one of drive cycle of the switching element 6 or for each of a plurality of drive cycles (e.g., every two cycles or the like). Note that, in the present embodiment, the drive cycle of the switching element 6 is one cycle of PWM control. Further, In such case, the calculation unit 11 changes the drive capacity of the drive unit 9 in a predetermined PWM cycle based on a deviation ΔV obtained in a prior PWM cycle before the predetermined PWM cycle. Specifically, the calculation unit 11 obtains the deviation ΔV for each PWM cycle, and changes the drive capacity of the drive unit 9 in the next PWM cycle based on the deviation ΔV obtained in the previous PWM cycle.

<Specific Configuration Example of Capacitors C1 and C2>

In the present embodiment, the capacitors C1 and C2 constituting the voltage dividing circuit 15 are formed on the same semiconductor chip, that is, they are included in the same semiconductor device. Hereinafter, two specific configuration examples of the capacitors C1 and C2 will be described with reference to FIGS. 2 and 3.

[1] First Configuration Example

Figure 2:
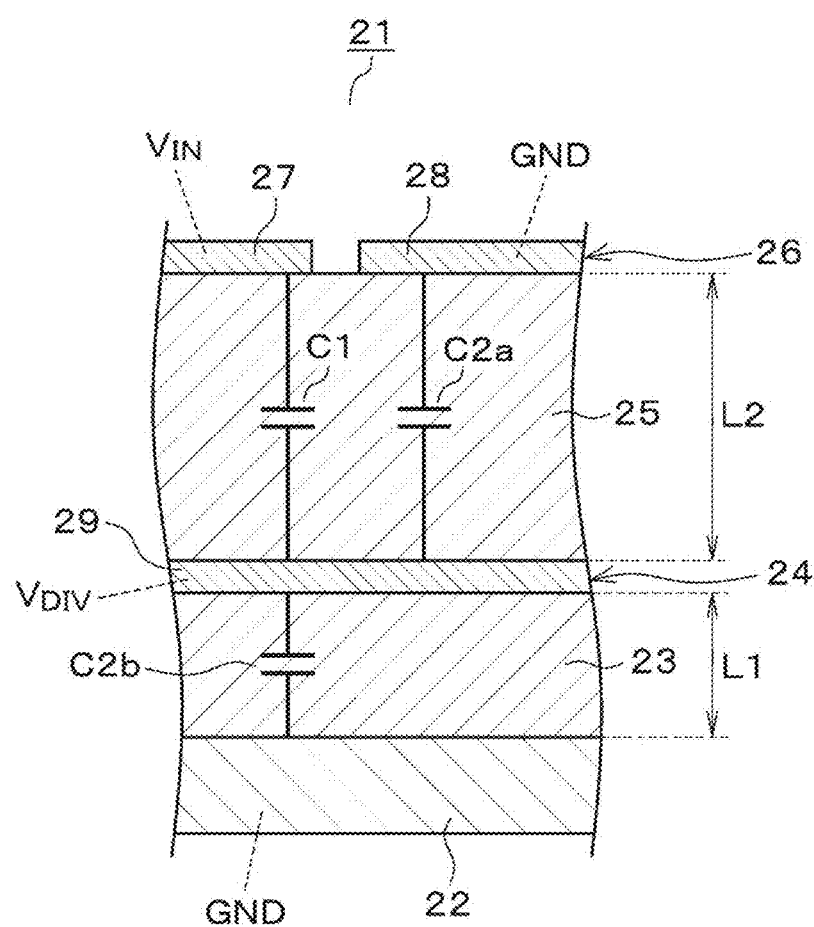
FIG. 2 is a specific first configuration example of a capacitor constituting a voltage dividing circuit according to the first embodiment, and is a schematic cross-sectional view of a semiconductor device.

As shown in FIG. 2, in the first configuration example, capacitors C1 and C2 providing the voltage dividing circuit 15 are formed on the same semiconductor device 21 by using an oxide film. Specifically, the semiconductor device 21 is configured by laminating a first dielectric layer 23, a second conductor layer 24, a second dielectric layer 25, and a third conductor layer 26 on a semiconductor substrate 22 in this written order. The semiconductor substrate 22 is, for example, a bulk substrate, an SOI substrate, or the like. The first dielectric layer 23 and the second dielectric layer 25 are, for example, $SiO32$ or the like. The second conductor layer 24 and the third conductor layer 26 are, for example, aluminum or the like.

In such case, a distance between the second conductor layer 24 and the third conductor layer 26, that is, a dimension L2 in the thickness direction of the second dielectric layer 25, is designed to be sufficiently greater than a distance between the semiconductor substrate 22 and the second conductor layer 24, that is, a dimension L1 in the thickness direction of the first dielectric layer 23. The "thickness direction" (or height in FIG. 3) mentioned here is a thickness direction of the semiconductor device 21. The dimension L2 in the thickness direction of the second dielectric layer 25 is set to have a value such that a voltage similar to the surge tolerance voltage, for example, 1200 V, can be secured as the breakdown voltage of the capacitors C1 and C2.

Wiring 27 and wiring 28 are formed on the third conductor layer 26. The wiring 27 is connected to the terminal P1 to which the input voltage VIN is given. The wiring 28 is connected to the terminal P3 to which a ground serving as a reference potential of the circuit is given. Note that, in the specification, the ground may be abbreviated as GND. Wiring 29 is formed on the second conductor layer 24. The wiring 29 is connected to the node N3 to which the voltage dividing voltage VDIV is applied. In such case, the semiconductor substrate 22 is connected to the GND.

According to the above configuration, the capacitor C1 is provided by/as a capacitance formed between the wiring 27 of the third conductor layer 26 and the wiring 29 of the second conductor layer 24, and a capacitor C2a, which is a part of the capacitor C2, is provided by/as a capacitance formed between the wiring 28 of the third conductor layer 26 and the wiring 29 of the layer 24. Further, according to the above configuration, a capacitor C2b, which is a part of the capacitor C2, is provided by/as a capacitance formed between the wiring 29 of the second conductor layer 24 and the semiconductor substrate 22. In such case, the capacitor C2 is provided as parallel combined capacitances of the capacitors C2a and C2b.

Note that, in such case, the capacitor C2b is a parasitic capacitance unintentionally formed due to the structure of the semiconductor device 21. As described above, in the first configuration example, the capacitor C1, which is one of the pair of capacitors C1 and C2, and the capacitor C2a, which is a part of the other, is provided by the capacitance formed between the third conductor layer 26 and the second conductor layer 24, and the capacitor C2b, which is also a part of the other of the pair of capacitors C1 and C2, is provided by the capacitance formed between the second conductor layer 24 and the semiconductor substrate 22.

[2] Second Configuration Example

Figure 3:
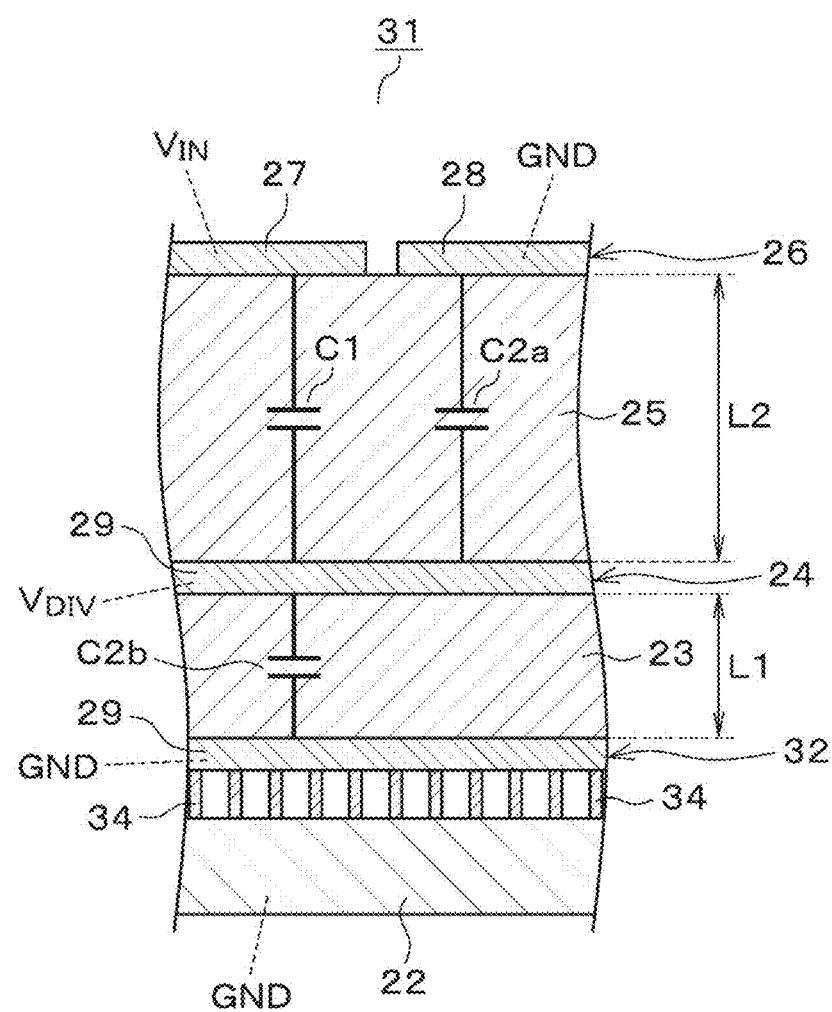
FIG. 3 is a specific second configuration example of a capacitor constituting the voltage dividing circuit according to the first embodiment, and is a schematic cross-sectional view of the semiconductor device.

As shown in FIG. 3, in the second configuration example, the capacitors C1 and C2 forming the voltage dividing circuit 15 are provided on the same semiconductor device 31 by using an oxide film. The semiconductor device 31 of the second configuration example is different from the semiconductor device 21 of the first configuration example in that the first conductor layer 32 is added. The semiconductor device 31 is configured such that the first conductor layer 32, the first dielectric layer 23, the second conductor layer 24, the second dielectric layer 25, and the third conductor layer 26 are laminated/layered in this order on the semiconductor substrate 22. The first conductor layer 32 is, for example, aluminum or the like, similar to the second conductor layer 24 or the like.

Wiring 33 is formed on the first conductor layer 32. The wiring 33 is connected to the terminal P3. The first conductor layer 32 is connected to the semiconductor substrate 22 via a plurality of vias 34. In FIG. 3, only some vias are indicated by reference numerals. In such case, the via 34 functions as a short-circuit portion that short-circuits between the first conductor layer 32 and the semiconductor substrate 22. In the second configuration example, a distance between the first conductor layer 32 and the second conductor layer 24 is the dimension L1 in the thickness direction of the first dielectric layer 23. In such case, the thickness direction dimension L1 of the first dielectric layer 23 and the thickness direction dimension L2 of the second dielectric layer 25 are designed to have the same dimensions as those of the first configuration example.

According to the above configuration, the capacitor C2b, which is a part of the capacitor C2, is provided by/as the capacitance formed between the wiring 29 of the second conductor layer 24 and the wiring 33 of the first conductor layer 32. As described above, in the second configuration example, the capacitor C1, which is one of the pair of capacitors C1 and C2, and the capacitor C2a, which is a part of the other, are provided by the capacitance formed between the third conductor layer 26 and the second conductor layer 24, and the capacitor C2b, which is also a part of the other of the pair of capacitors C1 and C2, is provided by the capacitance formed between the second conductor layer 24 and the first conductor layer 32.

The above-described embodiment provides the following effects. The pair of capacitors C1 and C2 constituting the voltage dividing circuit 15 of the signal detection circuit 10 in the present embodiment are included in the same semiconductor device 21 or 31. The semiconductor device 21 is configured by sequentially laminating a first dielectric layer 23, a second conductor layer 24, a second dielectric layer 25, and a third conductor layer 26 in this order on a semiconductor substrate 22. The semiconductor device 31 is configured by sequentially laminating a first conductor layer 32, a first dielectric layer 23, a second conductor layer 24, a second dielectric layer 25, and a third conductor layer 26 in this order on a semiconductor substrate 22.

In the semiconductor device 21, the capacitor C1 and the capacitor C2a, which is a part of the capacitor C2, are provided by the capacitance formed between the third conductor layer 26 and the second conductor layer 24, and the capacitor C2b, which is also a part of capacitor C2, is provide by the capacitance formed between the second conductor layer 24 and the semiconductor substrate 22. In the semiconductor device 31, the capacitor C1 and the capacitor C2a, which is a part of the capacitor C2, are provided by the capacitance formed between the third conductor layer 26 and the second conductor layer 24, and the capacitor C2b, which is also a part of the capacitor C2, is provided by the capacitance formed between the second conductor layer 24 and the first conductor layer 32.

According to each of the above configurations, since the pair of capacitors C1 and C2 constituting the voltage dividing circuit 15 are configured on the same semiconductor device 21 or 31, the relative error between the capacitors C1 and C2 can be suppressed to have a small value. In other words, the variation in the specific accuracy, which is the accuracy of the voltage dividing ratio of the voltage dividing circuit 15, can be reduced, and the detection accuracy is improved. The reason why the relative error between the capacitors C1 and C2 can be suppressed to a small value in the configuration of the present embodiment is as follows.

That is, when the capacitors C1 and C2 constituting the voltage dividing circuit 15 are mounted as external components of an IC such as a chip capacitor or the like, the capacitors C1 and C2 respectively have independent variations, thereby possibly causing a greater voltage dividing error. On the other hand, in the semiconductor devices 21 and 31 of the present embodiment, the capacitance values of the capacitors C1 and C2a both depend on the dimension L2 in the thickness direction of the second dielectric layer 25, and the capacitance value of the capacitors C2b depends on the dimension L1 in the thickness direction of the first dielectric layer 23.

In the semiconductor devices 21 and 31, although the variations of the dimension L1 and the dimension L2 independently occur, according to the above configuration, the variation caused by the dimension L2 is the same (i.e., evenly occurs) among the capacitor C1 and the capacitor C2a, which is a part of the capacitor C2. Therefore, according to each of the above configurations, the relative error between the pair of capacitors C1 and C2 constituting the voltage dividing circuit 15, that is, the voltage dividing error due to the voltage dividing circuit 15 can be suppressed to a small value.

Of the above configurations, the semiconductor device 21 of FIG. 2 may have the following problems. That is, the capacitor C2 has, respectively partially composed therein, the capacitor C2a which is a part of the capacitance formed between the third conductor layer 26 and the second conductor layer 24, and the capacitor C2b which is also a part of the capacitance formed is between the second conductor layer 24 and the semiconductor substrate 22.

In the above configuration of FIG. 2, the capacitor C2a is connected to the source of the switching element 6, that is, GND via the wiring 28 of the third conductor layer 26, but the capacitor C2b is connected to GND via the semiconductor substrate 22. In general (or conventionally), a semiconductor substrate has a resistance component, thereby, in the above configuration, for example, when considering a detection of a detection-target signal accompanied by a steep change under a surge superimposed thereon, its frequency characteristic may be lowered and the detection accuracy may deteriorate. On the other hand, the semiconductor device 31 of FIG. 3 includes a first conductor layer 32 added to the semiconductor device 21 and a plurality of vias 34 short-circuiting between the first conductor layer 32 and the semiconductor substrate 22.

In the semiconductor device 31 of FIG. 3 having such a configuration, the capacitor C2b is not only connected to the source of the switching element 6, that is, GND, via the semiconductor substrate 22 having a resistance component, but is also connected to GND via the wiring 33 of the first conductor layer 32. In such a configuration, when a voltage such as a surge is applied to the voltage dividing circuit 15, the electric current does not pass/flow through the semiconductor substrate 22 but passes through the first conductor layer 32 having a lower impedance. Therefore, according to the above configuration, the frequency characteristic is not deteriorated due to the resistance component of the semiconductor substrate 22, that is, the frequency characteristic is improved, and as a result, the detection accuracy is improved.

Further, in the semiconductor device 31, the first conductor layer 32 connected to the semiconductor substrate 22 via the plurality of vias 34 is also connected to GND, and has approximately the same potential as the semiconductor substrate 22 in its entire region. Therefore, according to the present embodiment, it is not necessary to form a trench as in a configuration of the fourth embodiment described later, thereby a bulk substrate can be used as the semiconductor substrate 22, and the manufacturing cost of the semiconductor device 31 is suppressed to a low value.

Figure 4:
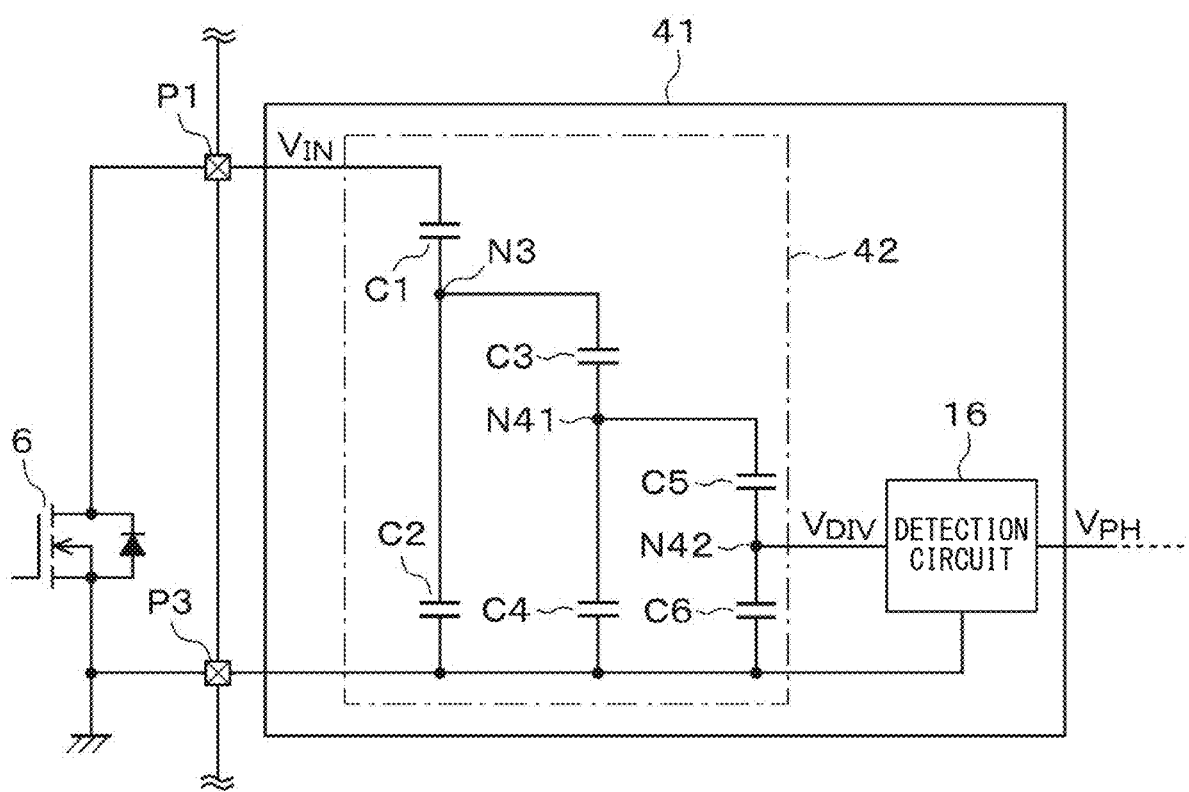
FIG. 4 is a diagram schematically showing a circuit configuration of a signal detection circuit according to a second embodiment.
Figure 5:
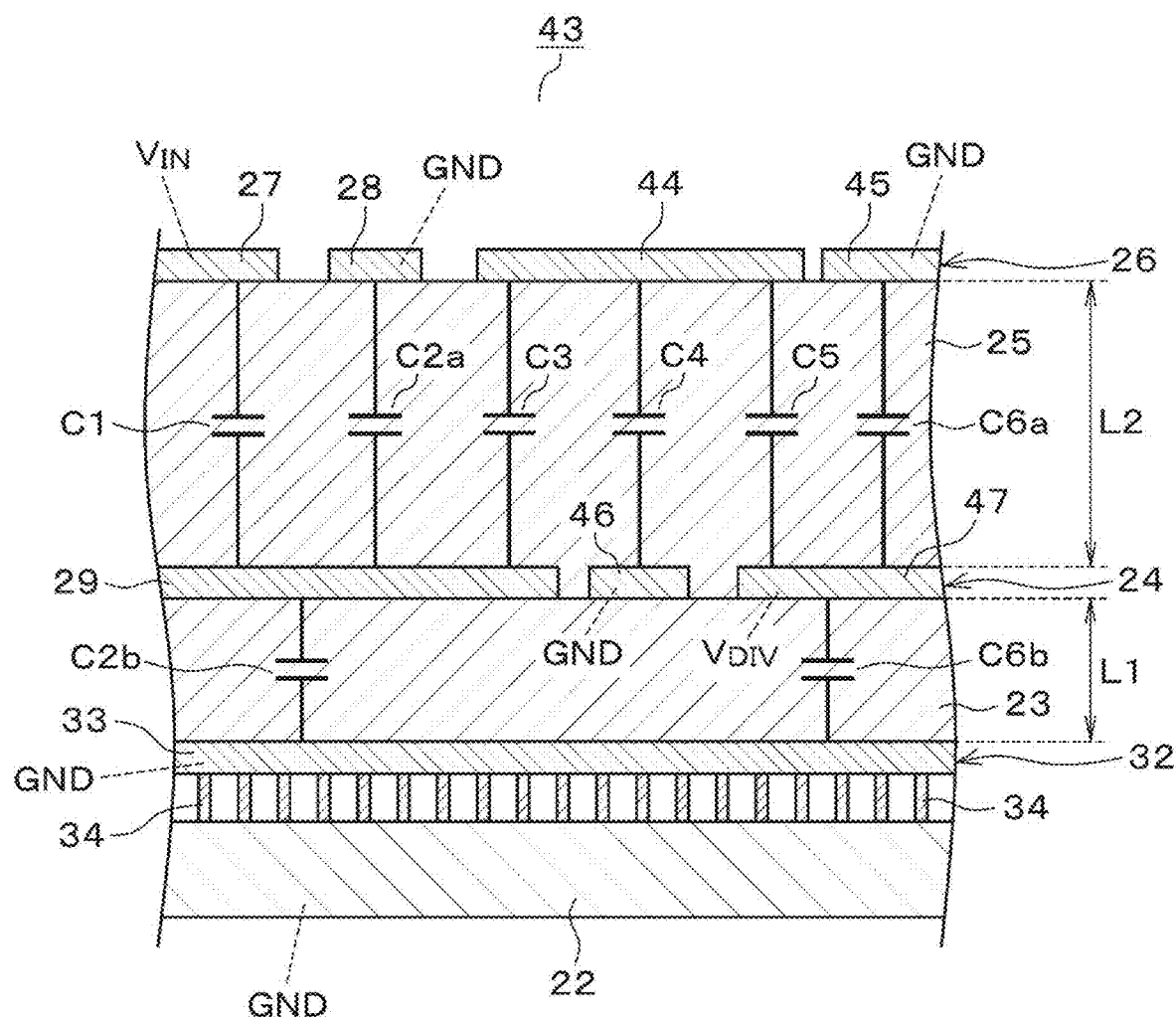
FIG. 5 shows a specific configuration example of a capacitor constituting the voltage dividing circuit according to the second embodiment, and is a schematic cross-sectional view of the semiconductor device.
Figure 6:
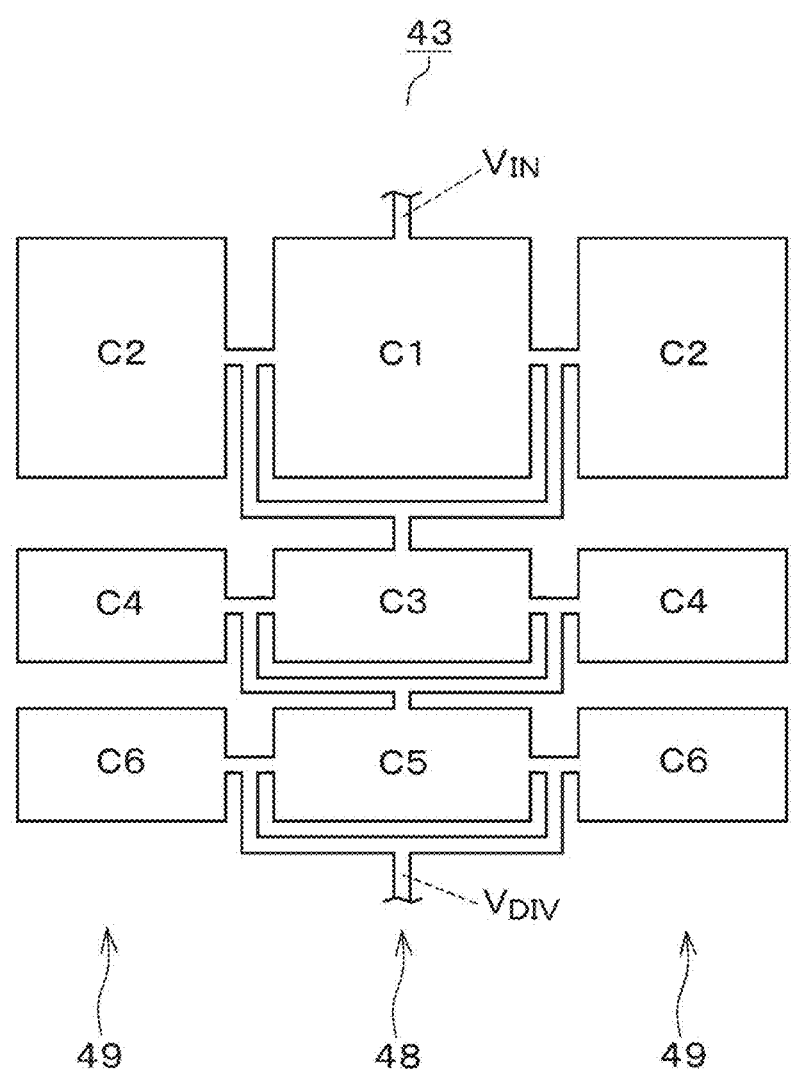
FIG. 6 is a diagram schematically showing an example of a planar layout of a capacitor in the semiconductor device according to the second embodiment.

Second Embodiments, FIGS. 4-6, Three-Stage Voltage Divider

Hereinafter, the second embodiment in which the configuration of the signal detection circuit has been changed with respect to the first embodiment will be described with reference to FIGS. 4 to 6.

<Circuit Configuration of Signal Detection Circuit>

As shown in FIG. 4, with respect to the signal detection circuit 10 of the first embodiment shown in FIG. 1, the present embodiment is different in that a signal detection circuit 41 includes a voltage dividing circuit 42 instead of the voltage dividing circuit 15, together with other points.

The voltage dividing circuit 42 is different from the voltage dividing circuit 15 in that capacitors C3 to C6 are added to form a three-stage voltage divider. One terminal of the capacitor C3 is connected to the node N3, and the other terminal of the capacitor C3 is connected to the terminal P3 via the capacitor C4. One terminal of the capacitor C5 is connected to a node N41 which is an interconnection node of the capacitors C3 and C4, and the other terminal of the capacitor C5 is connected to the terminal P3 via the capacitor C6. As described above, the voltage dividing circuit 42 is configured to include the capacitors C1 and C2, the capacitors C3 and C4, and the capacitors C5 and C6, all of which function as a pair of voltage dividing capacitors connected in series.

That is, the voltage dividing circuit 42 has a three pairs (three stages) of voltage dividing capacitors, and has a multi-stage configuration in which the voltage divided by the pair of voltage dividing capacitors in the previous stage is further divided by the paired voltage dividing capacitors in the subsequent stage, which is, more specifically, a three-stage configuration. The voltage dividing circuit 42 outputs a voltage divided by the capacitors C5 and C6 in the final stage as an output voltage, that is, the voltage dividing voltage VDIV from a node N42 which is an interconnection node of the capacitors C5 and C6.

A voltage dividing ratio K (=VIN/VDIV) of the entire voltage dividing circuit 42 can be expressed by the following equation (1). However, the voltage dividing ratios of respective stages are designated as K1, K2, and K3. More specifically, the voltage dividing ratio by the capacitors C1 and C2 is K1, the voltage dividing ratio by the capacitors C3 and C4 is K2, and the voltage dividing ratio by the capacitors C5 and C6 is K3.

$$K=K1 \times K2 \times K3 \quad (1)$$

In the present embodiment, when the input voltage VIN is an assumed maximum value, for example, 1200V, the voltage dividing ratio K is set to an upper limit value of an input voltage range of the detection circuit 16 in the subsequent stage, for example, 3V. That is, in the present embodiment, the voltage dividing ratio of each stage is set so that the voltage dividing ratio K is "400". When the voltage dividing ratios K1, K2, and K3 of respective stages are set to have equal values, the voltage dividing ratios K1, K2, and K3 have the cube root of K=400, and can be expressed by the following equation (2).

$$K1=K2=K3=7.36 \quad (2)$$

Here, assuming that the input capacitance viewed from between terminals P1 to P3, that is, between VIN and GND is about 1 pF, the capacitance values of C1 to C6 are as follows.

$C1$: 1.16 [pF] $C2$: 6.37 [pF]

$C3$: 1.16 [pF] $C4$: 6.37 [pF]

$C5$: 1.16 [pF] $C6$: 6.37 [pF]

Therefore, the total capacitance value of C1 to C6 is about 22 pF.

Specific Configuration Example of Capacitors C1 to C6

The capacitors C1 to C6 constituting the voltage dividing circuit 42 of the present embodiment are included in the same (i.e., one) semiconductor device just like the capacitors C1 and C2 constituting the voltage dividing circuit 15 of the first embodiment. As shown in FIG. 5, in the present embodiment, capacitors C1 to C6 forming the voltage dividing circuit 42 are formed on one semiconductor device 43 by using an oxide film. The semiconductor device 43 has the same layer structure as the semiconductor device 31 of the first embodiment.

In such case, wirings 44 and 45 are formed on the third conductor layer 26 in addition to the wirings 27 and 28. The wiring 44 is connected to the node N41. The wiring 45 is connected to the terminal P3 to which GND is given. Further, in such case, wirings 46 and 47 are formed on the second conductor layer 24 in addition to the wiring 29 connected to the node N3. The wiring 46 is connected to the terminal P3 to which GND is given. The wiring 47 is connected to the node N42 to which the voltage dividing voltage VDIV is applied.

According to the above configuration, the capacitors C1 and C2 are configured in the same manner as the semiconductor device 31 of the first embodiment. Further, according to the above configuration, the capacitor C3 is provided as the capacitance formed between the wiring 44 of the third conductor layer 26 and the wiring 29 of the second conductor layer 24, and the capacitor C4 is provided as the capacitance formed between the wiring 44 of the third conductor layer 26 and the wiring 46 of the second conductor layer 24. As described above, in the semiconductor device 43 of the present embodiment, the pair of capacitors C3 and C4 are provided as the capacitance formed between the third conductor layer 26 and the second conductor layer 24. Note that, though a parasitic capacitance is also formed between the wiring 46 of the second conductor layer 24 and the wiring 33 of the first conductor layer 32, such a parasitic capacitance is formed between two GNDs, it will not be charged nor discharged. That is, because such parasitic capacitance does not affect the function of the voltage dividing circuit 42, illustration of the parasitic capacitance is omitted from the drawing.

With the above configuration, the capacitor C5 is provided as the capacitance formed between the wiring 44 of the third conductor layer 26 and the wiring 47 of the second conductor layer 24, and a capacitor C6a, which is a part of the capacitor C6, is provided as the capacitance formed between the wiring 45 of the third conductor layer 26 and the wiring 47 of the second conductor layer 24. Further, according to the above configuration, a capacitor C6b, which is a part of the capacitor C6, is provided as the capacitance formed between the wiring 47 of the second conductor layer 24 and the wiring 33 of the first conductor layer 32. In such case, the capacitor C6 is provided by the parallel combined capacitors of the capacitors C6a and C6b.

In such case, the capacitor C6b is a parasitic capacitance unintentionally formed due to the structure of the semiconductor device 43. As described above, in the semiconductor device 43 of the present embodiment, the capacitor C5, which is one of the pair of capacitors C5 and C6, and the capacitor C6a, which is a part of the other of the pair of capacitors C5 and C6, are provided by the capacitance formed between the third conductor layer 26 and the second conductor layer 24, and the capacitor C6a, which is also a part of the other of the pair of capacitors C5 and C6.

Specific Layout Example of Capacitors C1 to C6

As shown in FIG. 6, the planar layout of the capacitors C1 to C6 is provided as a common centroid arrangement so that a pair ratio of the capacitors C1 and C2, a pair ratio of the capacitors C3 and C4, and a pair ratio of the capacitors C5 and C6 can be obtained. That is, the semiconductor device 43 is provided with a first region 48 and a second region 49.

The first region 48 and the second region 49 are arranged along a predetermined direction on a plane surface that is orthogonal to the thickness direction of the semiconductor substrate 22. In the present embodiment, the first region 48 and the second region 49 are arranged along the left-right direction of FIG. 6. Hereinafter, the left-right direction in FIG. 6 will be referred to as a lateral direction. The second region 49 is divided into plural regions, and into two regions in this case, and the divided plural regions are arranged so as to sandwich the first region 48 in the lateral direction. One of the pair of voltage dividing capacitors, that is, capacitors C1, C3, and C5 are provided in the first region 48. In the second region 49, the other of the pair of voltage dividing capacitors, that is, the capacitors C2, C4, and C6 is provided.

As described above, the capacitors C1 to C6 constituting the voltage dividing circuit 42 of the signal detection circuit 41 of the present embodiment are included in the same semiconductor device 43. Therefore, also in the present embodiment, as in the first embodiment, the relative errors between the capacitors C1 and C2, between the capacitors C3 and C4, and between the capacitors C5 and C6 are suppressed to a small value. In other words, the variation in the specific accuracy, which is the accuracy of the voltage dividing ratio of the voltage dividing circuit 42, is reduced, and the detection accuracy is improved.

Further, according to the present embodiment, the following effects are obtainable. That is, the voltage dividing circuit 42 of the signal detection circuit 41 in the present embodiment has a multi-stage configuration having a plurality of pairs of voltage dividing capacitors, specifically, a three-stage configuration. According to the voltage dividing circuit 42 having such a multi-stage configuration, the following merits are achievable as compared with the one-stage configuration such as the voltage dividing circuit 15 of the first embodiment. That is, when the voltage dividing circuit 15 having the one-stage configuration of the first embodiment is used to realize the same voltage dividing ratio "K=400" as the voltage dividing circuit 42 of the present embodiment, if the input capacitance is set to 1 pF as in the present embodiment, it is necessary to set the capacitance value of the capacitor C1 to 1 pF and the capacitance value of the capacitor C2 to 400 pF. Then, the total capacitance value of the capacitors C1 and C2 becomes 401 pF, and in order to secure such capacitance, the circuit area required to configure the voltage dividing circuit 15 becomes very large.

On the other hand, in case of realizing the voltage dividing ratio "K=400" in the voltage dividing circuit 42 having the three-stage configuration of the present embodiment, as described above, the total capacitance value of the capacitors C1 to C6 can be set to a value as low as about 22 pF. Therefore, according to the configuration of the present embodiment, the total capacitance value of the voltage dividing capacitance constituting the voltage dividing circuit 42 can be suppressed to about 1/20 of the configuration of the first embodiment, thereby the circuit area required to provide the voltage dividing circuit 42 can similarly be suppressed to about 1/20.

In the present embodiment, the planar layout of the capacitors C1 to C6 is a common centroid arrangement. For example, when focusing on the arrangement of the pair of capacitors C1 and C2, the layout is such that the second region 49 in which the capacitor C2 is provided is arranged on both sides in the lateral direction of the first region 48 in which the capacitor C1 is provided. In FIG. 6, left portion of C2 is located on the left side, and right portion of C2 is located on the right side. In a semiconductor device, due to a manufacturing process, a gradient (thickness change), the thickness may change from a thicker portion to a thinner portion along the lateral direction, i.e., from one end to the other end, for example.

Then, according to the planar layout as described above, the first half capacitor C2 provided in the left second region 49 on one end side (left side in FIG. 6) has the largest thickness, the capacitor C1 has an intermediate thickness, and the capacitor C2 formed in the right second region 49 on the other end side (right side in FIG. 6) has the smallest thickness. Therefore, the thickness of the capacitor C1 is an intermediate value, and the thickness of the capacitors C2 in total is an average value of the largest value and the smallest value, that is, an intermediate value. That is, according to the above-mentioned planar layout, the (average) thicknesses of the capacitors C1 and C2 are substantially the same regardless of the process gradient, and the pair ratio thereof can be maintained satisfactorily, such that a desired/design ratio K is provided for each stage.

As described above, according to the present embodiment, by arranging the planar layout of the capacitors C1 to C6 in a common centroid arrangement, the pair ratio of the capacitors C1 and C2, the pair ratio of the capacitors C3 and C4, and the pair ratio of the capacitors C5 and C6 are maintained preferably, and, as a result, the specific accuracy, which is the accuracy of the voltage dividing ratio of the voltage dividing circuit 42, becomes better, and the detection accuracy is further improved.

Figure 7:
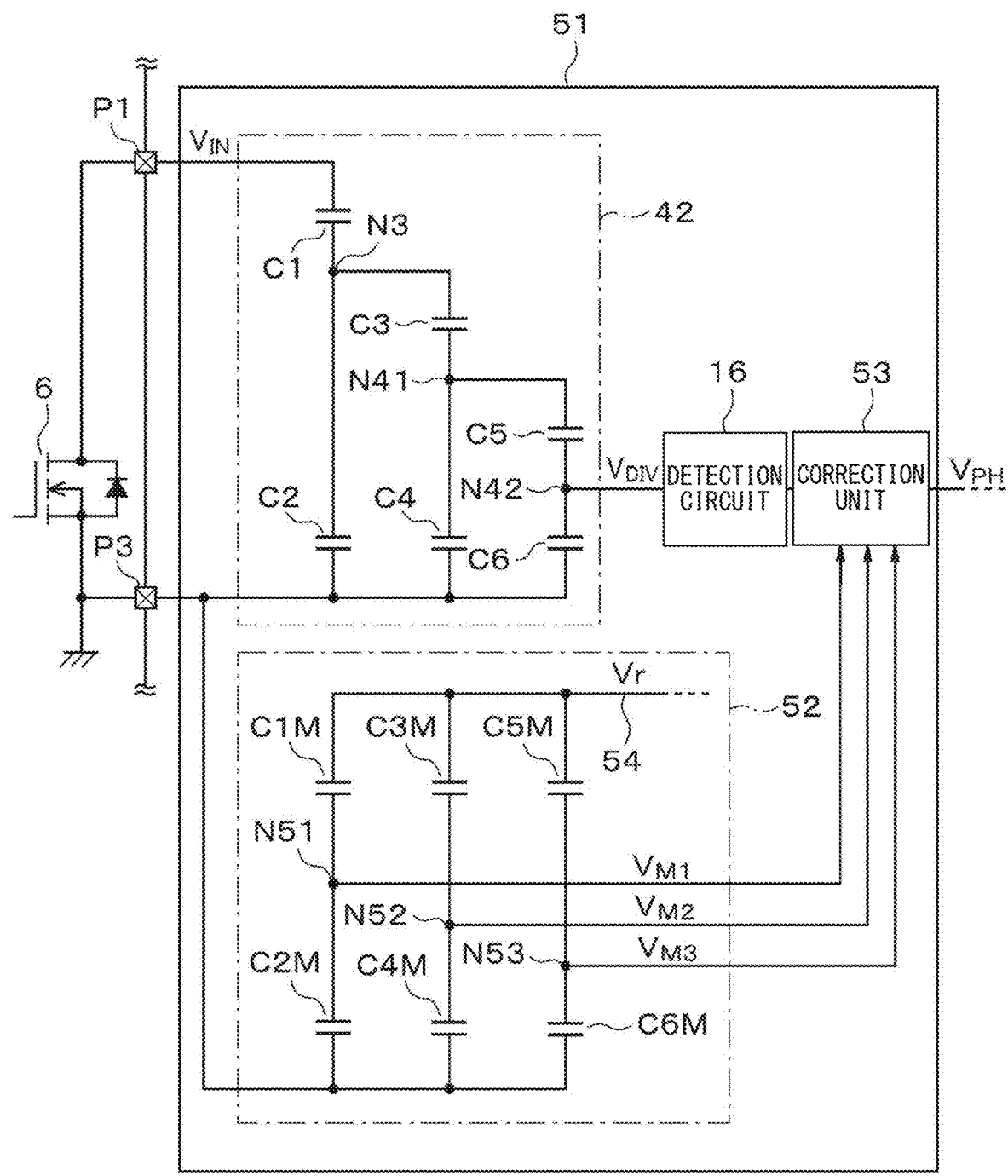
FIG. 7 is a diagram schematically showing a circuit configuration of the signal detection circuit according to a third embodiment.
Figure 8:
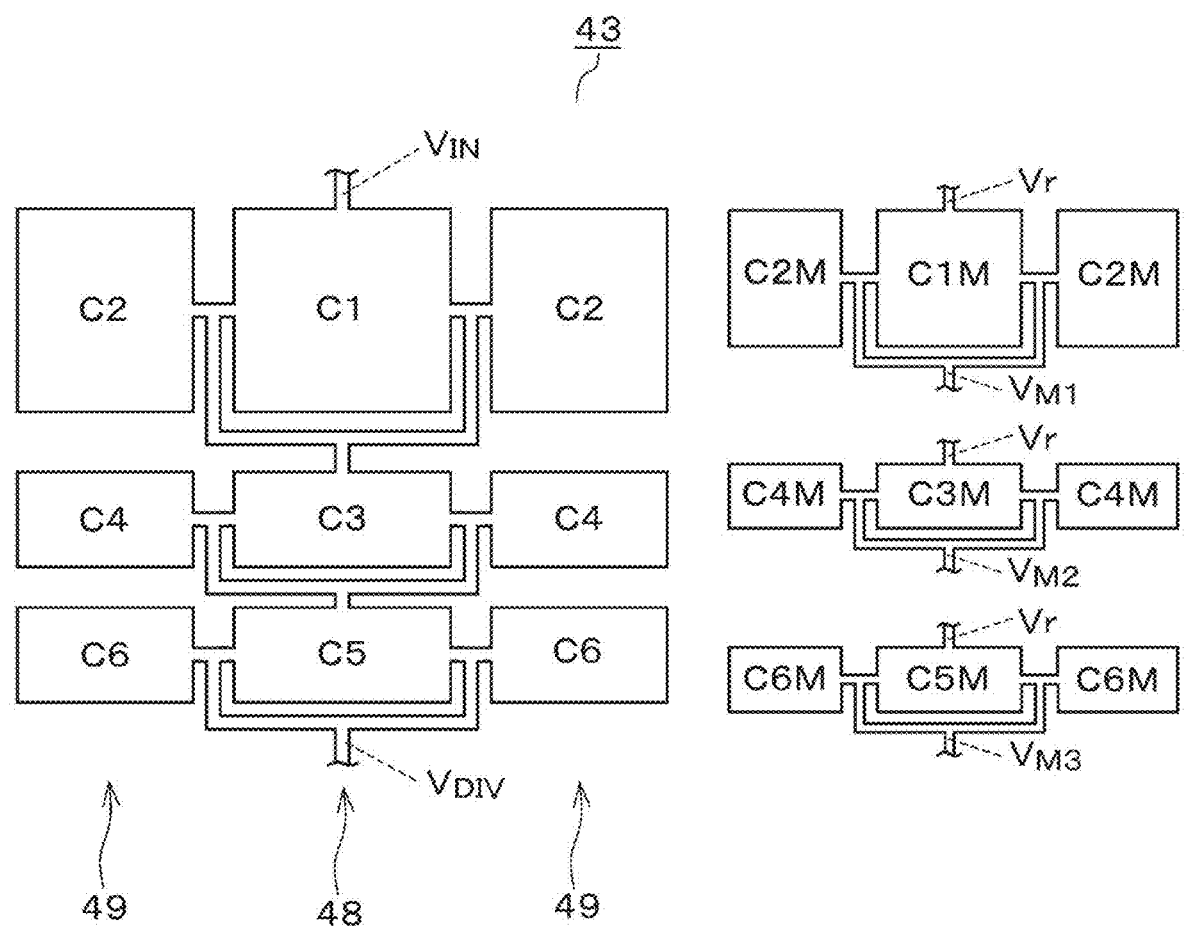
FIG. 8 is a diagram schematically showing an example of a planar layout of a capacitor in the semiconductor device according to the third embodiment.
Figure 9:
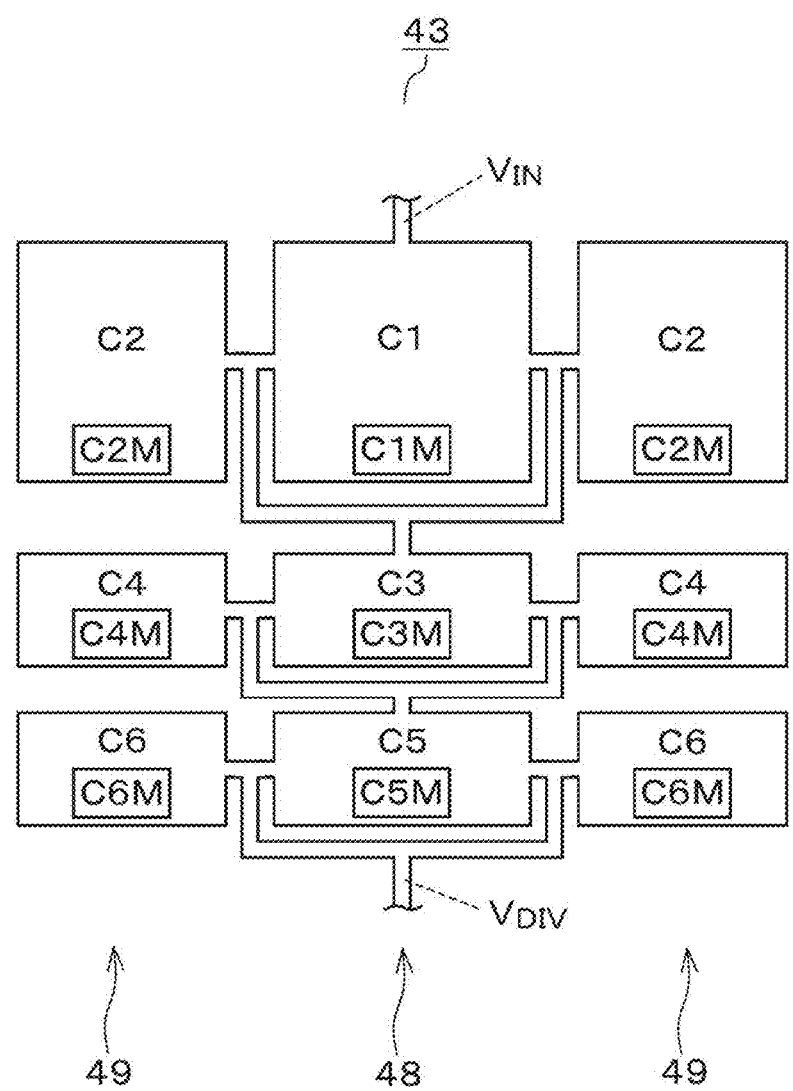
FIG. 9 is a diagram schematically showing another example of a planar layout of a capacitor in the semiconductor device according to the third embodiment.

Third Embodiment, FIGS. 7-9

Hereinafter, the third embodiment, in which the configuration of the signal detection circuit has been changed with respect to the second embodiment, will be described with reference to FIGS. 7 to 9. <Circuit configuration of signal detection circuit> As shown in FIG. 7, a signal detection circuit 51 of the present embodiment is different from the signal detection circuit 41 of the second embodiment shown in FIG. 4 in that a monitor circuit 52 and a correction unit 53 are added, together with other points.

The monitor circuit 52 includes a pair of capacitors C1M and C2M connected in series, a pair of capacitors C3M and C4M connected in series, and a pair of capacitors C5M and C6M connected in series. The capacitors C1M and C2M are laid out on the semiconductor substrate 22 in the same manner as the capacitors C1 and C2 constituting the voltage dividing circuit 42, and function as a pair of monitor capacitors.

The capacitance values of the capacitors C1M and C2M are sufficiently smaller than the capacitance values of the capacitors C1 and C2, and the ratio of the capacitors C1M and C2M is set to the same value as the ratio of the capacitors C1 and C2. One terminal of the capacitor C1M is connected to a reference voltage line 54, and the other terminal is connected to the terminal P3 via the capacitor C2M. A reference voltage Vr, which is a highly accurate known voltage with little fluctuation inside the IC, is given to the reference voltage line 54.

The capacitors C3M and C4M are laid out on the semiconductor substrate 22 in the same manner as the capacitors C3 and C4 constituting the voltage dividing circuit 42, and function as a pair of monitor capacitors. The capacitance values of the capacitors C3M and C4M are sufficiently smaller than the capacitance values of the capacitors C3 and C4, and the ratio of the capacitors C3M and C4M is set to the same value as the ratio of the capacitors C3 and C4. One terminal of the capacitor C3M is connected to the reference voltage line 54, and the other terminal is connected to the terminal P3 via the capacitor C4M.

The capacitors C5M and C6M are laid out on the semi-conductor substrate 22 in the same manner as the capacitors C5 and C6 constituting the voltage dividing circuit 42, and function as a pair of monitor capacitors. The capacitance values of the capacitors C5M and C6M are sufficiently smaller than the capacitance values of the capacitors C5 and C6, and the ratio of the capacitors C5M and C6M is set to the same value as the ratio of the capacitors C5 and C6. One terminal of the capacitor C5M is connected to the reference voltage line 54, and the other terminal is connected to the terminal P3 via the capacitor C6M.

With the above configuration, the monitor circuit 52 divides the predetermined reference voltage Vr by the capacitors C1M and C2M to the voltage VM1, at the same voltage dividing ratio K1 similar to that of the capacitors C1 and C2 of the voltage dividing circuit 42, and outputs the voltage VM1 from a node N51, which is an interconnection node of the capacitors C1M and C2M. Further, the monitor circuit 52 divides the predetermined reference voltage Vr by the capacitors C3M and C4M to the voltage VM2, at the same voltage dividing ratio K2 similar to that of the capacitors C3 and C4 of the voltage dividing circuit 42, and outputs the voltage VM2 from a node N52, which is an interconnection node of the capacitors C3M and C4M. Further, the monitor circuit 52 divides the predetermined reference voltage Vr by the capacitors C5M and C6M to the voltage VM3, at the same voltage dividing ratio K3 similar to that of the capacitors C5 and C6 of the voltage dividing circuit 42, and outputs the voltage VM3 from node N53, which is an interconnection node of the capacitors C5M and C6M.

The correction unit 53 is configured to include an A/D converter and the like. Note that, in the present specification, an A/D converter may be abbreviated as ADC. The voltages VM1, VM2, and VM3, which are the output voltages of the monitor circuit 52, are input to the correction unit 53. The correction unit 53 corrects the detection voltage VPH representing a detection value by the detection circuit 16 based on the voltages VM1, VM2, and VM3. That is, the voltage VM1 is a voltage corresponding to the voltage dividing ratio by the current capacitors C1M and C2M, and ultimately by extension, the voltage dividing ratio K1 by the capacitors C1 and C2.

Further, the voltage VM2 is a voltage corresponding to the voltage dividing ratio by the current capacitors C3M and C4M, and ultimately by extension, the voltage dividing ratio K2 by the current capacitors C3 and C4. Further, the voltage VM3 is a voltage corresponding to the voltage dividing ratio by the current capacitors C5M and C6M, and ultimately by extension, the voltage dividing ratio K3 by the current capacitors C5 and C6. The correction unit 53 calculates the values of the voltage dividing ratios K1, K2, and K3 based on the known voltage values of the reference voltage Vr and the voltages VM1, VM2, and VM3.

The correction unit 53 obtains a difference between (i) the values of the voltage dividing ratios K1 to K3 thus calculated and (ii) a target value (=7.36) of the voltage dividing ratios K1 to K3, and corrects the detection voltage VPH for cancelling such a difference. That is, the correction unit 53 corrects the deviation of the voltage dividing ratios K1 to K3 from the target value. The correction unit 53 outputs the detection voltage VPH after such correction. The correction by the correction unit 53 described above is performed at the time of initial setting when starting up the device or system provided with the signal detection circuit 51, and is also performed at a predetermined timing after the device or system is started.

In another embodiment, not shown, the monitor circuit can have a multi-stage arrangement similar to that of the voltage dividing circuit 43. Thus, a single divided voltage (such as a three-stage divided voltage) may be monitored to determine a three-stage division constant (K1*K2*K3) based on a three-stage division voltage VMDIV (not shown) and the reference voltage Vr. This embodiment reduces the processing burden of the correction unit 53.

Specific Layout Example of Capacitors C1M to C6M

As shown in FIGS. 8 and 9, the planar layout of the capacitors C1M to C6M is a common centroid arrangement so that the pair ratio of the capacitors C1M and C2M, the pair ratio of the capacitors C3M and C4M and the pair ratio of the capacitors C5M and C6M can all be sized for desired dividing ratios. The first layout example shown in FIG. 8 is an example in which the capacitors C1 to C6 of the voltage dividing circuit 42 and the capacitors C1M to C6M of the monitor circuit 52 are arranged in separate regions.

In the first layout example, the semiconductor device 43 is provided with a first region 55 and a second region 56, which are dedicated regions for forming the capacitors C1M to C6M. The first region 55 and the second region 56 are provided so as to have the same mode as the first region 48 and the second region 49. One of the pair of monitor capacitors, that is, capacitors C1M, C3M, and C5M are formed in the first region 55. In the second region 56, the other of the pair of monitor capacitors, that is, the capacitors C2M, C4M, and C6M are formed.

The second layout example shown in FIG. 9 is an example in which the capacitors C1 to C6 of the voltage dividing circuit 42 and the capacitors C1M to C6M of the monitor circuit 52 are arranged in the same region, that is, the capacitors C1M to C6M of the monitor circuit 52 are arranged in the voltage dividing circuit 42. In the second layout example, one of the pair of voltage dividing capacitors, that is, the capacitors C1, C3, and C5, and one of the pair of monitor capacitors, that is, the capacitors C1M, C3M, and C5M are formed in the first region 48. In the second region 49, the other of the pair of monitor capacitors, that is, the capacitors C2M, C4M, and C6M are formed.

The present embodiment described above also has the same effects as those of the second embodiment, and also has the following effects. That is, the signal detection circuit 51 of the present embodiment includes the capacitors C1M to C6M laid out on the semiconductor substrate 22 in the same manner as the capacitors C1 to C6 constituting the voltage dividing circuit 42, and is provided with the monitor circuit 52 and the correction unit 53, which is circuit 52 dividing the reference voltage Vr at the same dividing ratio as the voltage dividing circuit 42 and outputting the divided voltage, the ratio of which is determined by the capacitors C1M to C6M, and which is a unit 53 correcting the detection voltage detected by the detection circuit 16 based on the output voltage of the monitor circuit 52.

With such a configuration, even if a voltage dividing ratio deviation occurs in which the dividing ratio deviates from the target value, due to capacitance variation between each layer of the semiconductor device 43, that is, between the third conductor layer 26 and the second conductor layer 24, and between the second conductor layer 24 and the first conductor layer 32, it is possible to correct the deviation of the dividing ratio. Therefore, according to the above configuration, a deterioration in detection accuracy due to capacitance variation between the layers of the semiconductor device 43 is suppressible. Further, the correction by the correction unit 53 is performed at the time of initial setting when starting up the device or system, and is also performed at a predetermined timing after the device or system is started. In such manner, it is possible to correct not only the deviation of the initial voltage dividing ratio that occurs in the manufacturing process but also the deviation of the voltage dividing ratio that occurs due to aging deterioration or the like.

The planar layout of the capacitors C1M to C6M of the monitor circuit 52 has a common centroid arrangement as in the capacitors C1 to C6 of the voltage dividing circuit 42. By doing so, the pair ratio of the capacitors C1M and C2M, the pair ratio of the capacitors C3M and C4M and the pair ratio of the capacitors C5M and C6M can be preferably maintained, and as a result, the accuracy of the voltage dividing ratio of the monitor circuit 52 can be maintained, thereby improving the specific accuracy, i.e., an accuracy of correction by the correction unit 53. Further, in the present embodiment, the capacitance values of the capacitors C1M to C6M of the monitor circuit 52 are respectively set to a value sufficiently smaller than the capacitance values of the capacitors C1 to C6 of the voltage dividing circuit 42, thereby suppressing an increase in circuit area due to the addition of the monitor circuit 52 as small as possible.

Fourth Embodiment, FIG. 10

Hereinafter, the fourth embodiment in which the specific configuration of the capacitor constituting the voltage dividing circuit has been changed with respect to the second embodiment will be described with reference to FIG. 10 <Specific configuration example of capacitors C1 to C6> As shown in FIG. 10, the capacitors C1 to C6 constituting the voltage dividing circuit 42 of the present embodiment are included in the same semiconductor device as in the second embodiment.

In such case, the parallel composite capacitance of the capacitors C11 and C12 constitutes the capacitor C1, the parallel composite capacitance of the capacitors C21 and C22 constitutes the capacitor C2, the parallel composite capacitance of the capacitors C31 and C32 constitutes the capacitor C3, the parallel composite capacitance of the capacitors C41 and C42 constitutes the capacitor C4, the parallel composite capacitance of the capacitors C51 and C52 constitutes the capacitor C5, and the parallel composite capacitance of the capacitors C61 and C62 constitutes the capacitor C6.

As shown in FIG. 10, in the present embodiment, the capacitors C1 to C6 forming the voltage dividing circuit 42 are formed on a same semiconductor device 61 by using an oxide film. The semiconductor device 61 has the same layer structure as the semiconductor device 43 of the second embodiment. The semiconductor device 61 is different from the semiconductor device 43 in that a semiconductor substrate 62 is provided in place of the semiconductor substrate 22. The semiconductor substrate 62 is, for example, an SOI (Silicon-on-insulator) substrate. In such case, the dimension of the substrate 62 is designed so that the dimension L1 in the thickness direction of the first dielectric layer 23 and the dimension L2 in the thickness direction of the second dielectric layer 25 has the same value. These dimensions L1 and L2 are set to values that substantially guarantee the surge tolerance voltage of, for example, 1200 V, as the breakdown voltage of the capacitors C1 to C6.

In such case, wirings 63 to 65 are formed on the third conductor layer 26. The wiring 63 is connected to the node N3. The wiring 64 is connected to the node N41. The wiring 65 is connected to the node N42 to which the voltage dividing voltage VDIV is applied. In such case, wirings 66 to 72 are formed on the second conductor layer 24. The wiring 66 is connected to the terminal P1 to which the input voltage VIN is given. The wiring 67 is connected to the terminal P3 to which GND is given. The wiring 68 is connected to the wiring 63 of the third conductor layer 26 via a via 73, that is, is connected to the node N3. The wiring 69 is connected to the terminal P3 to which GND is given.

The wiring 70 is connected to the wiring 64 of the third conductor layer 26 via a via 74, that is, is connected to the node N41. The wiring 71 is connected to the terminal P3 to which GND is given. The wiring 72 is connected to the wiring 65 of the third conductor layer 26 via a via 75, that is, is connected to the node N42. In such case, wirings 76 to 78 are formed on the first conductor layer 32. The wiring 76 is connected to the wiring 63 of the third conductor layer 26 via the via 73, that is, is connected to the node N3.

The wiring 77 is connected to the wiring 64 of the third conductor layer 26 via the via 74, that is, is connected to the node N41. The wiring 78 is connected to the wiring 65 of the third conductor layer 26 via the via 75, that is, is connected to the node N42. In such case as well, the first conductor layer 32 is connected to the semiconductor substrate 62 via a plurality of vias 34. However, in such case, the three wirings 76 to 78 formed on the first conductor layer 32 have different potentials from each other. Therefore, the semiconductor substrate 62 is provided with a trench 79 for insulatingly separating the three regions corresponding to the wirings 76 to 78 of the first conductor layer 32.

According to the above configuration, the capacitor C11 is provided as the capacitance formed between the wiring 63 of the third conductor layer 26 and the wiring 66 of the second conductor layer 24, and the capacitor C21 is provided as the capacitance formed between the wiring 63 of the third conductor layer 26 and the wiring 67 of the second conductor layer 24. Further, according to the above configuration, the capacitor C12 is provided as the capacitance formed between the wiring 66 of the second conductor layer 24 and the wiring 76 of the first conductor layer 32, and the capacitor C22 is provided as the capacitance formed between the wiring 67 and the second conductor layer 24 and the wiring 76 of the first conductor layer 32.

According to the above configuration, the capacitor C31 is provided as the capacitance formed between the wiring 64 of the third conductor layer 26 and the wiring 68 of the second conductor layer 24, and the capacitor C41 is provided as the capacitance formed between the wiring 64 of the third conductor layer 26 and the wiring 69 of the second conductor layer 24. Further, according to the above configuration, the capacitor C32 is provided as the capacitance formed between the wiring 68 of the second conductor layer 24 and the wiring 77 of the first conductor layer 32, and the capacitor C42 is provided as the capacitance formed between the wiring 69 and the second conductor layer 24 of the second conductor layer 24 and the wiring 77 of the first conductor layer 32.

According to the above configuration, the capacitor C51 is provided as the capacitance formed between the wiring 65 of the third conductor layer 26 and the wiring 70 of the second conductor layer 24, and the capacitor C61 is provided as the capacitance formed between the wiring 65 of the third conductor layer 26 are the wiring 71 of the second conductor layer 24. Further, according to the above configuration, the capacitor C52 is provided as the capacitance formed between the wiring 70 of the second conductor layer 24 and the wiring 78 of the first conductor layer 32, and the capacitor C62 is provided as the capacitance formed between the wiring 71 of the second conductor layer 24 and the wiring 78 of the first conductor layer 32.

As described above, in the semiconductor device 61 of the present embodiment, the capacitor C11 and the capacitor C21, which are respectively a part of one and the other of the pair of capacitors C1 and C2, are provided as the capacitance between the third conductor layer 26 and the second conductor layer 24, and the capacitor C12 and the capacitor C22, which are respectively a part of one and the other of the pair of capacitors C1 and C2, are provided as the capacitance formed between the second conductor layer 24 and the first conductor layer 32.

Further, in the semiconductor device 61 of the present embodiment, the capacitor C31 and the capacitor C41, which are respectively a part of one and the other of the pair of capacitors C3 and C4, are provided as the capacitance formed between the third conductor layer 26 and the second conductor layer 24, and the capacitor C41 and the capacitor C42, which are respectively a part of one and the other of the pair of capacitors C3 and C4, are provided as the capacitance formed between the second conductor layer 24 and the first conductor layer 32.

Further, in the semiconductor device 61 of the present embodiment, the capacitor C51 and the capacitor C61, which are respectively a part of one and the other of the pair of capacitors C5 and C6, are provided as the capacitance formed between the third conductor layer 26 and the second conductor layer 24, and the capacitor C61 and the capacitor C62, which are respectively a part of one and the other of the pair of capacitors C5 and C6, are provided as the capacitance formed between the second conductor layer 24 and the first conductor layer 32.

Further, in the semiconductor device 61 of the present embodiment, two breakdown voltages, i.e., (A) the breakdown voltage of the capacitors C11, C21, C31, C41, C51, and C61, which are the capacitors formed between the third conductor layer 26 and the second conductor layer 24, and (B) the breakdown voltage of the capacitors C12, C22, C32, C42, C52, and C62, which are the capacitors formed between the second conductor layer 24 and the first conductor layers 32, are made equal to each other by setting the distances between those layers.

As described above, the capacitors C1 to C6 constituting the voltage dividing circuit 42 of the present embodiment are included in the same semiconductor device 61. Therefore, the same effects as those of the second embodiment can be obtained by the present embodiment as well. Further, according to the present embodiment, the following effects are obtainable. In the semiconductor device 43 of the second embodiment, the capacitor C2b which is a part of the capacitor C2 and the capacitor C6b which is a part of the capacitor C6 both have variations due to the dimension L1, which incurs error in the dividing voltage and may deteriorate the accuracy of detection.

On the other hand, in the semiconductor device 61 of the present embodiment, the composite capacitance value of the capacitor C11, which is a part of the capacitor C1, and the capacitor C21, which is a part of the capacitor C2, depends on the dimension L2, and the composite capacitance value of the capacitor C11, which is a part of the capacitor C1, and the capacitor C22, which is a part of the capacitor C2, depends on the dimension L1. That is, in the semiconductor device 61, the capacitance values of the capacitors C1 and C2 depend on both of the dimensions L1 and L2.

Similarly, for the capacitors C3 and C4 and the capacitors C5 and C6, their respective capacitance values depend on both of the dimensions L1 and L2. Therefore, in the semiconductor device 61, even if the dimensions L1 and L2 vary/fluctuate independently, the relative errors between the capacitors C1 and C2, between the capacitors C3 and C4, and between the capacitors C5 and C6 can be suppressed to a small value. Therefore, according to the present embodiment, the voltage dividing error of the voltage dividing circuit 42 is further suppressible, and as a result, the detection accuracy can further be improvable.

However, the semiconductor device 43 of the second embodiment is superior to the semiconductor device 61 of the present embodiment in the following points. That is, in the semiconductor device 61, in order to secure/guarantee a relatively high voltage as the breakdown voltage of the capacitors C1 to C6, which is about the same as the surge tolerance voltage, the thickness of each of the first dielectric layer 23 and the second dielectric layer 25 needs to be increased. That is, it is necessary to make the dimensions L1 and L2 relatively large.

On the other hand, in the semiconductor device 43, a relatively high voltage is securable as the breakdown voltage of the capacitors C1 to C6 by making only the thickness of the first dielectric layer 23, that is, the dimension L1, relatively large. Therefore, in the semiconductor device 43, the thickness of the second dielectric layer 25, that is, the dimension L2 can be made smaller than that of the semiconductor device 61. Therefore, according to the semiconductor device 43 of the second embodiment, it is possible to reduce the manufacturing steps and the manufacturing cost of the semiconductor device 43, relative to those of the semiconductor device 61 of the present embodiment.

Other Embodiments

The present disclosure is not limited to the embodiments that have been described above and illustrated in the drawings, but can freely be modified, combined, or expanded without departing from the gist of the present disclosure. The numerical values and the like shown in each of the above embodiments are merely examples, and the present disclosure is not limited thereto. The present disclosure is not limited to the signal detection circuits 10, 41 and 51 that detect the detection-target signal which is a signal of the main terminal of the switching element 6 constituting the lower arm of the half bridge circuit 4, but is also applicable generally to a signal detection circuit that detects the detection-target signal which may be a signal of the main terminal of the switching element 6 constituting an upper arm of the half bridge circuit 4, for example.

The voltage dividing circuit 42 has a three-stage configuration, but a multi-stage configuration may also be used, that is for example, a two-stage configuration, a four- or more-stage configuration may also be used as long as the desired effects of reducing the circuit area size are obtainable. Note that, the number of stages of the voltage dividing circuit 42 to maximize the effects of reducing the circuit area size may be determinable according to the voltage value of the detection-target signal, the desired voltage dividing ratio, and the like.

In the semiconductor devices 43 and 61, the planar layout of the capacitors C1 to C6 and C1M to C6M is a common centroid arrangement in the above. However, if the accuracy of the voltage dividing ratio is obtained (i.e., is guaranteed) to a desired degree, other planar layouts can also be used.

In the signal detection circuit 51, the capacitors C1M to C6M constituting the monitor circuit 52 are configured to be included in the same semiconductor device 43 as the semiconductors C1 to C6 constituting the voltage dividing circuit 42, that is, are formed on the same semiconductor chip. However, they may be formed as a separate semiconductor device, that is, may be formed on another semiconductor chip.

Although the present disclosure has been described in accordance with the examples of embodiment, it is understood that the present disclosure is not limited to such examples or structures. The present disclosure incorporates various modifications and variations within the scope of equivalents. In addition, various combinations and modes, and further, other combinations and forms including/omitting only one element, or more than one element or less than one element added/subtracted thereto/therefrom are also within the sprit and the scope of the present disclosure.

What is claimed is:

1. A signal detection circuit that detects a detection-target signal, which is a signal of a main terminal of a switching element, the signal detection circuit comprising:
   a voltage dividing circuit having a pair of voltage dividing capacitances connected in series, for dividing and outputting a voltage between the main terminals of the switching element by the pair of voltage dividing capacitances; and
   a detection circuit detecting the detection-target signal based on an output voltage of the voltage dividing circuit, wherein
   the pair of voltage dividing capacitances are included in one semiconductor device, and
   the semiconductor device is
   (A) configured to be disposed on a semiconductor substrate, as a layered body in an order of a first conductor layer, a first dielectric layer, a second conductor layer, a second dielectric layer, and a third conductor layer,
   (B) configured to have (i) one of the pair of voltage dividing capacitances and a part of an other of the pair of voltage dividing capacitances provided by a capacitance formed between the third conductor layer and the second conductor layer, and (ii) a part of the other of the pair of voltage dividing capacitances provided by a capacitance formed between the second conductor layer and the first conductor layer, and
   (C) provided with a short-circuit portion that short-circuits between the first conductor layer and the semiconductor substrate is provided.

2. The signal detection circuit of claim 1, wherein the voltage dividing circuit
   includes a plurality of pairs of voltage dividing capacitances,
   has multi-stage configuration in which a voltage divided by a pair of voltage dividing capacitances in one stage is further divided by another pair of voltage dividing capacitances in another/later/subsequent stage, and
   outputs a divided voltage divided by a pair of voltage dividing capacitances in a last stage.

3. The signal detection circuit of claim 1, wherein the semiconductor substrate has, formed thereon, a first region in which one of the pair of voltage dividing capacitances and a second region in which an other of the pair of voltage dividing capacitances, the first and second regions being arranged along a predetermined direction on a substrate surface orthogonal to a thickness direction of the semiconductor substrate, and
   the second region is divided into plural regions, and
   the plural divided regions are arranged to sandwich the first region in the predetermined direction.

4. The signal detection circuit of claim 1, wherein the semiconductor device is:
   configured to have (a) one of the pair of voltage dividing capacitances and (b) a part of an other of the pair of voltage dividing capacitances as a capacitance formed between the third conductive layer and the second conductive layer, and configured to have (c) a part of the one of the pair of voltage dividing capacitances and (d) an other part of the other of the pair of voltage dividing capacitances as a capacitance formed between the second conductive layer and the first conductive layer; and
   a breakdown voltage of the capacitance formed between the third conductive layer and the second conductive layer is made equal to a breakdown voltage of the capacitance formed between the second conductive layer and the first conductive layer by respectively setting an appropriate distance as an inter-layer distance between the third conductive layer and the second conductive layer and between the second conductive layer and the first conductive layer.

5. The signal detection circuit of claim 1 further comprising:
   a monitor circuit having a pair of monitor capacitors laid out on the semiconductor substrate in a same manner as the pair of voltage dividing capacitances, and dividing and outputting a divided reference voltage at a voltage dividing ratio similar to that of the voltage dividing circuit by using the pair of monitor capacitors; and
   a correction unit correcting a detection value of the detection circuit based on an output voltage of the monitor circuit.

6. A signal detection circuit configured to detect a detection-target signal as an input voltage, the signal detection circuit comprising: a voltage dividing circuit having at least a first pair of voltage dividing capacitors connected in series for dividing an input voltage, and configured to output a divided voltage; and a detection circuit configured to detect the divided voltage, wherein the first pair of voltage dividing capacitors are included in one semiconductor device, and the semiconductor device: (A) includes: (i) a semiconductor substrate, (ii) a first conductor layer, (iii) a first dielectric layer, (iv) a second conductor layer, (v) a second dielectric layer, (vi) a third conductor layer, and (vii) a short-circuit portion configured to short-circuit the first conductor layer and the semiconductor substrate, and (B) is configured such that: (i) the first pair of voltage dividing capacitors includes a first upstream capacitor and a first downstream capacitor, (ii) the first upstream capacitor is formed between: (a) a first portion of the third conductive layer connected to the input voltage, and (b) a first portion of the second conductive layer, (iii) a first portion of the first downstream capacitor is formed between (a) the first portion of the second conductive layer and (b) a second portion of the third conductive layer connected to a ground, and (v) a second portion of the first downstream capacitor is formed between (a) the first portion of the second conductive layer, and (b) the first conductive layer connected to the ground.

7. The signal detection circuit of claim 6, wherein:
   the first pair of voltage dividing capacitors forms a first stage,
   the first stage is configured to receive the input voltage and to output a first stage divided voltage,
   the voltage dividing circuit further includes a second pair of voltage dividing capacitors,
   the second pair of voltage dividing capacitors forms a second stage,
   the second stage is configured to receive the first stage divided voltage and to output a second stage divided voltage, and
   the voltage dividing circuit is configured to output the divided voltage from a last stage of the voltage dividing circuit.

8. The signal detection circuit of claim 6, wherein:
the first pair of voltage dividing capacitors is formed in a first planar centroid design such that:
- (i) the first capacitor is located in a center region,
- (ii) the second capacitor includes a left portion located leftward of the first capacitor in a left region, and
- (iii) the second capacitor further includes a right portion located rightward of the first capacitor in a right region.

9. The signal detection circuit of claim 7, wherein:
the second pair of voltage dividing capacitors includes a second upstream capacitor and a second downstream capacitor forming the second stage,
second upstream capacitor is formed between the first portion of the second conductor layer and a third portion of the third conductor layer,
the second downstream capacitor is formed between the third conductor layer and a second portion of the second conductor layer, and
a first breakdown voltage of the first capacitor is set approximately equal to a second breakdown voltage of the second capacitor by setting a first thickness of the first dielectric layer and by setting a second thickness of the second dielectric layer.

10. The signal detection circuit of claim 8 further comprising:
a monitor circuit having at least a first pair of monitor capacitors formed in a monitor planar centroid design that has a same symmetry as the first planar centroid design, wherein
- (i) the first pair of monitor capacitors forms a first-stage monitor voltage divider configured to divide a reference voltage, and
- (ii) the first pair of monitor capacitors have a division ratio approximately equal to that of the first pair of voltage dividing capacitors; and a correction unit configured to correct a detection value of the detection circuit based on an output voltage of the monitor circuit.

11. A signal detection circuit including:
a voltage dividing circuit;
a monitor circuit; and
a detection circuit; wherein
the voltage dividing circuit includes:
- (i) a semiconductor substrate,
- (ii) a first conductor layer,
- (iii) a first dielectric layer,
- (iv) a second conductor layer,
- (v) a second dielectric layer,
- (vi) a third conductor layer, and
- (vii) a first pair of voltage dividing capacitors forming a first stage, wherein:
- (i) the first stage includes a first upstream capacitor and a first downstream capacitor,
- (ii) the first upstream capacitor is formed between: (a) a first portion of the third conductive layer connected to an input voltage, and (b) a first portion of the second conductive layer,
- (iii) a first portion of the first downstream capacitor is formed between (a) the first portion of the second conductive layer and (b) a second portion of the third conductive layer connected to a ground, and
- (iv) a second portion of the first downstream capacitor is formed between (a) the first portion of the second conductive layer, and (b) the first conductive layer connected to the ground.

12. The signal detection circuit of claim 11, wherein:
the voltage dividing circuit further includes a second stage,
the second stage includes a second upstream capacitor and a second downstream capacitor,
second upstream capacitor is formed between the first portion of the second conductor layer and a third portion of the third conductor layer, and
the second downstream capacitor is formed between the third conductor layer and a second portion of the second conductor layer.

* * * * *